United States Patent
Li et al.

(10) Patent No.: US 9,817,074 B1
(45) Date of Patent: Nov. 14, 2017

(54) METHOD AND APPARATUS FOR AUTOMATICALLY COMPUTING WORK ACCURACY OF A BATTERY MANAGEMENT SYSTEM OFFLINE

(71) Applicant: Bordrin Motor Corporation, Southfield, MI (US)

(72) Inventors: Yonghua Li, Ann Arbor, MI (US); Zhiwei Zhang, Shanghai (CN)

(73) Assignee: BORDRIN MOTOR CORPORATION, INC., Southfield, MI (US)

( * ) Notice: Subject to any disclaimer, the term of this patent is extended or adjusted under 35 U.S.C. 154(b) by 0 days.

(21) Appl. No.: 15/439,382

(22) Filed: Feb. 22, 2017

(51) Int. Cl.
   *G01R 31/36* (2006.01)
   *B60L 3/00* (2006.01)
   *B60L 3/12* (2006.01)
   *B60L 11/18* (2006.01)

(52) U.S. Cl.
   CPC ........ *G01R 31/3651* (2013.01); *B60L 3/0046* (2013.01); *B60L 3/12* (2013.01); *B60L 11/1861* (2013.01); *B60L 11/1874* (2013.01)

(58) Field of Classification Search
   CPC ............... G01R 31/3651; B60L 3/0046; B60L 11/1874; B60L 11/1861; B60L 3/12
   See application file for complete search history.

(56) References Cited

U.S. PATENT DOCUMENTS

| | | | | |
|---|---|---|---|---|
| 8,791,710 B2* | 7/2014 | Bracker | ...... | H01M 10/42 320/118 |
| 9,244,132 B2* | 1/2016 | Bond | ...... | G01R 31/3679 |
| 2011/0148424 A1* | 6/2011 | Chiang | ...... | G01R 31/3624 324/427 |
| 2016/0372806 A1* | 12/2016 | Lee | ...... | H01M 10/6572 |

FOREIGN PATENT DOCUMENTS

CN        101762800 A    *   6/2010

\* cited by examiner

*Primary Examiner* — Thomas Ingram
(74) *Attorney, Agent, or Firm* — Brinks Gilson & Lione

(57) ABSTRACT

A method and an apparatus for automatically computing work accuracy of a battery management system (BMS) includes the steps of controlling an automobile component simulation module to work, sending a work command to the BMS at the test moment t, and reading a prediction parameter, stopping working when the work command is completed, reading a work parameter and computing state of power (SOP) test accuracy of the BMS, determining whether a temperature of the battery pack exceeds a temperature threshold, if so, controlling a thermal management module to start working, and returning to the determination step, and otherwise, reading a stabilized parameter and performing computation to obtain state of charge (SOC) test accuracy of the BMS.

9 Claims, 3 Drawing Sheets

METHOD AND APPARATUS FOR AUTOMATICALLY COMPUTING WORK ACCURACY OF A BATTERY MANAGEMENT SYSTEM OFFLINE

BACKGROUND

1. Field of the Invention

The present invention relates to the field of automobile batteries, and in particular, to a method and an apparatus for automatically computing work accuracy of a battery management system (BMS) offline.

2. Description of Related Art

Vehicles, especially electric vehicles, includes numerous high-voltage electric components, such as a high-voltage battery pack, a high-voltage junction box, an electric motor and controller, an electric air-conditioner and controller, a DC/DC converter, and a charger. A battery powering one or more of these components is one of the most important components. How to effectively and accurately estimate a state of charge (SOC) and a state of power (SOP) of the battery is important for ensuring that the battery does not exceed an allowable battery voltage/current/temperature value while satisfying a power requirement of a vehicle and for ensuring a service life of the battery.

An existing BMS may estimate an SOC and an SOP of an automobile battery pack. Unfortunately, with regard to how to determine whether the estimations are accurate, it is impossible to determine directly by means of measurements. Therefore, it is necessary to compute work accuracy of the BMS to further determine whether estimates of the SOC and SOP are accurate. In an existing method, it is necessary to approximately determine work accuracy of a BMS by performing numerous uncontrolled experiments while the vehicle is running. Such a methodology is both time-consuming and human labor-intensive. Further, computation must be completed while the vehicle is running, and, because in an actual running process of a vehicle, manual operation is needed, resulting in measurement uncertainty, an expected conclusion may not always be obtained.

Chinese Patent CN201010102766.2 provides a test platform for a BMS, where a battery parameter is numerically simulated by using a battery voltage simulator and a constant-current source. Although this method may be automated, in this method, work accuracy of the BMS is computed by numerically simulating the automobile battery rather than being determined based on measurement obtained when operating the battery. During an operation of an automobile battery, numerous parameters are uncontrollable and unpredictable. This numerical simulation platform cannot ensure accurate prediction of the battery behavior, and therefore, may only be appropriate in a controlled laboratory environment and is not applicable to industrial production setting.

SUMMARY

An objective of the present invention is to provide a method and an apparatus for automatically computing work accuracy of a BMS offline with regard to the foregoing problems previously described. The objective of the present invention may be achieved by means of the following technical solutions.

A method for automatically computing work accuracy of a BMS offline includes the following steps:

s1) controlling, by a vehicle control unit, an automobile component simulation module to start working, and reading, by the BMS, a work state of a battery pack;

s2) generating, by the vehicle control unit, a test moment t, sending a work command to the BMS at the test moment t, and reading a prediction parameter fed back by the BMS;

s3) controlling, by the vehicle control unit, the automobile component simulation module to stop working when a work command completion time occurs;

s4) reading, by the vehicle control unit, a work parameter fed back by the BMS, and with reference to the prediction parameter of step s2), computing SOP test accuracy $\epsilon_{SOP}$ of the BMS;

s5) determining, by the vehicle control unit, whether a temperature of the battery pack exceeds a temperature threshold, if so, controlling a thermal management module to start working, and returning to step s5), and otherwise, performing step s6); and s6) reading, by the vehicle control unit, a stabilized parameter of the BMS at a current moment, and with reference to the prediction parameter of step s2), performing computation to obtain SOC test accuracy $\epsilon_{SOC}$ of the BMS.

The process of generating a test moment includes:

s21) generating, by the vehicle control unit, a random number N;

s22) determining, by the vehicle control unit, whether the random number N is greater than a random number threshold $N_{cal}$, if so, performing step s23), and otherwise, returning to step s21); and 23) generating, by the vehicle control unit, a test moment t according to the random number N, where the test moment t is specifically:

$$t = t_{min} + N \times T$$

where $t_{min}$ is a minimum work time of the automobile component simulation module, and T is a specified cycle time.

The prediction parameter includes an SOC value $SOC_{cal1}$ and a minimum voltage value $V_{min}$, predicted by the BMS, of the battery pack when the work command is completed.

The minimum voltage value $V_{min}$ is specifically:

$$V_{min} = \min(V_{req}, V_{cal})$$

where $V_{req}$ is a voltage value required in the work command sent by the vehicle control unit, and $V_{cal}$ is an available voltage value obtained by the BMS by means of computation according to the read work state of the battery pack.

Step s4) includes:

s41) reading, by the vehicle control unit, a work parameter, that is, a voltage value $V_{cal1}$ of the battery pack at a current moment, fed back by the BMS; and s42) computing, by the vehicle control unit, the SOP test accuracy $\epsilon_{SOP}$ of the BMS according to the voltage value of the battery pack at the current moment obtained in step s41), where the SOP test accuracy $\epsilon_{SOP}$ is specifically:

$$\varepsilon_{SOP} = \left| \frac{V_{cal1} - V_{min}}{V_{cal1}} \right|.$$

Step s6) includes:

s61) reading, by the vehicle control unit, a stabilized parameter of the BMS at a current moment, that is, a voltage value $V_{cal2}$ of the battery pack at a current moment;

s62) reversely deriving, by the vehicle control unit according to the voltage value of the battery pack at the current moment obtained in step s61), an SOC value $SOC_{cal2}$ of the battery pack at the current moment from an SOC-OCV (open circuit voltage) curve of the battery pack; and s63) computing, by the vehicle control unit, the SOC test accuracy $SOC_{cal2}$ of the BMS according to the SOC value $\epsilon_{SOC}$ of the battery pack at the current moment obtained in step s62), where the SOC test accuracy $SOC_{cal2}$ is specifically:

$$\varepsilon_{SOC} = \left| \frac{SOC_{cal2} - SOC_{cal1}}{SOC_{cal2}} \right|.$$

An apparatus for automatically computing work accuracy of a BMS offline as stated above is configured to detect the work accuracy of the BMS offline connected to a battery pack and includes:

a vehicle control unit, connected to the BMS and configured to send a work command to the BMS and compute the work accuracy of the BMS according to a parameter fed back by the BMS;

an automobile component simulation module, connected to the battery pack and vehicle control unit separately and configured to provide consumption and charging, required by an automobile component, for the battery pack energy according to the work command of the vehicle control unit; and a thermal management module, connected to the battery pack and the vehicle control unit separately and configured to perform heat dissipation on the battery pack according to a command of the vehicle control unit.

The automobile component simulation module includes:

a resistor energy-consuming component, including a first relay and an energy-consuming resistor and configured to provide the energy consumption, required by the automobile component, for the battery pack according to the work command of the vehicle control unit; and an excitation charging component, including a second relay, an excitation power source, and a protective resistor and configured to provide the charging, required by the automobile component, for the battery pack according to the work command of the vehicle control unit.

The thermal management module includes a fan, a heat sink, and a water pump that are connected in series in sequence, and the fan, the heat sink, and the water pump are all connected to the battery pack to perform heat dissipation on the battery pack.

The thermal management module further includes an external power source, and the external power source is connected to the fan, the heat sink, and the water pump in series to provide work power for the fan, the heat sink, and the water pump. When the BMS is commanded to be in an "ON" state, the thermal management module is powered by battery energy from a high voltage bus. However, when the battery system is commanded to be in an "OFF" state, the thermal management module is powered by this external power source.

As compared with the prior art, the present invention has the following beneficial effects:

First, the apparatus can implement energy consumption and charging of a battery pack by connecting the battery pack to an automobile component simulation module without requiring that the vehicle be running. Meanwhile, because the automobile component simulation module is controlled by a vehicle control unit, durations of the energy consumption and charging can be accurately controlled. As compared with manual operation, experiment processes are more accurate, thereby further increasing an accuracy degree of a computing result of work accuracy of the BMS.

Second, detection by the present apparatus on the BMS is performed on the basis of an actual automobile battery pack, which, as compared with testing the BMS in a simulating manner, preferably satisfies actual situations, covers more situations, and has higher accuracy.

Third, the apparatus is further connected to a thermal management module, so as to prevent an inaccurate detection result caused by an extremely high battery pack temperature and have higher accuracy.

Fourth, the automobile component simulation module has a resistor energy-consuming component as well as an excitation charging component. Not only an energy consumption situation of the battery pack is taken into consideration, but also a charging situation of the battery pack caused by automobile regenerative braking is taken into consideration. A broad scope is taken into consideration, and thorough detection is performed.

Fifth, the thermal management module is powered by an external power source instead of being powered directly by the battery pack when the battery pack is commanded to be "OFF" by the vehicle control unit, so as to prevent running of the thermal management module from affecting power consumption of the battery pack when battery pack is supposed to be commanded "OFF" by the vehicle control unit during testing, thereby further enhancing accuracy of the result.

Sixth, the Operation of the present method is simple, and a whole detection process can be automatically completed by only using a vehicle control unit to perform control. The costs are low and no human labor is consumed. Meanwhile, it is unnecessary to start an automobile. It is only necessary to implement simulation of charging and energy consumption of a battery by means of an automobile component simulation module, so as to further detect work accuracy of a BMS. The operation is convenient, the detection result is accurate, and the present method can be conveniently used during an automobile performance test.

Seventh, in this method, a test moment t is randomly generated, so as to prevent a detection result from being manually controlled because of a fixed detection moment, thereby improving detection precision.

Eighth, a generation process of the test moment t ensures that the test moment is definitely later than an end of a minimum work time of an automobile component simulation module, that is, ensuring that computation of accuracy of the BMS must be started after the automobile has worked for a period of time. Because when the automobile just starts running, work accuracy of the BMS is relatively accurate, and a deviation may possibly occur after the automobile works for a specific time, this test moment avoids a situation that a relatively great work accuracy error of the BMS is not detected because detection is performed at an initial moment.

Ninth, in a process of computing SOC test accuracy, the vehicle control unit controls, when a temperature of the battery pack exceeds a threshold, the thermal management module to lower the temperature of the battery pack and then, further read a parameter to perform computation, thereby avoiding a situation that a computation result of the SOC test accuracy is inaccurate because of an inaccurate reversely derived SOC value caused by an extremely high temperature.

Further objects, features and advantages of this invention will become readily apparent to persons skilled in the art after a review of the following description, with reference to the drawings and claims that are appended to and form a part of this specification.

DETAILED DESCRIPTION

The present invention is described below in detail by referring to accompanying drawings and specific examples. These examples are implemented on the premise of technical solutions of the present invention, and detailed implementation manners and specific operation processes are provided, but the protection scope of the present invention is not limited to the following examples.

Figure 2:
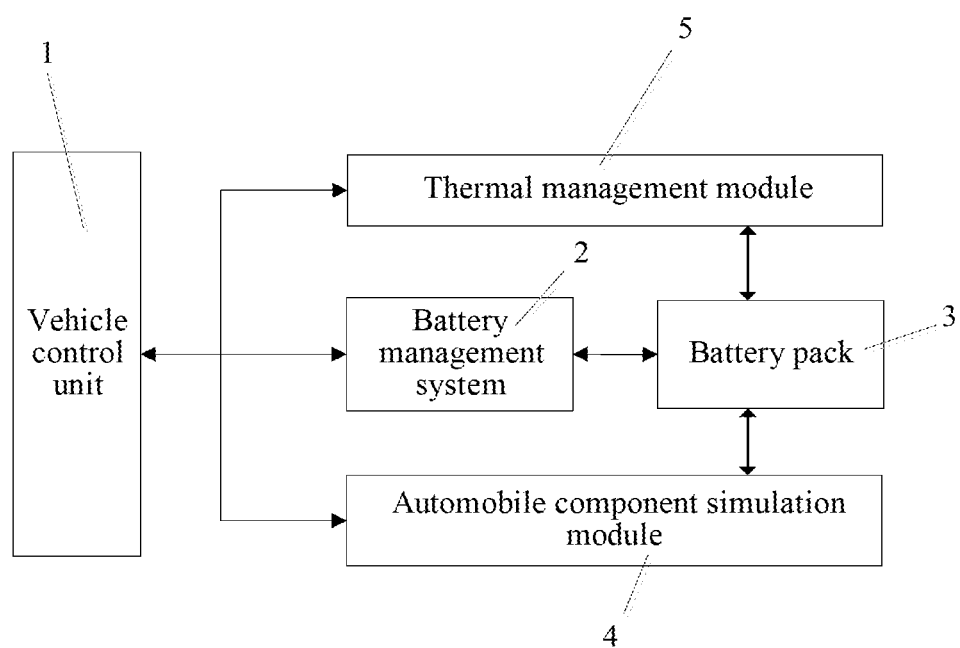
FIG. 2 is a schematic structural diagram of an apparatus for automatically computing work accuracy of BMS offline.

As shown in FIG. 2, this example provides an apparatus for automatically computing work accuracy of a BMS offline and configured to detect the work accuracy of the BMS connected to a battery pack offline. The apparatus includes a vehicle control unit 1 connected to the BMS 2 and configured to send a work command to the BMS 2 and compute the work accuracy of the BMS 2 according to a parameter fed back by the BMS 2. The apparatus further includes an automobile component simulation module 4 connected to the battery pack 3 and vehicle control unit 1 separately and configured to provide energy consumption and charging, required by an automobile component, for the battery pack 3 according to the work command of the vehicle control unit 1. Finally, the apparatus includes a thermal management module 5, connected to the battery pack 3 and the vehicle control unit 1 separately and configured to perform heat dissipation on the battery pack 3 according to a command of the vehicle control unit 1. When the BMS 2 is commanded to be in an "ON" state, the thermal management module 5 is powered by battery energy from a high voltage bus. However, when the BMS 2 is commanded to be in an "OFF" state, the thermal management module 5 is powered by this external power source.

Figure 4:
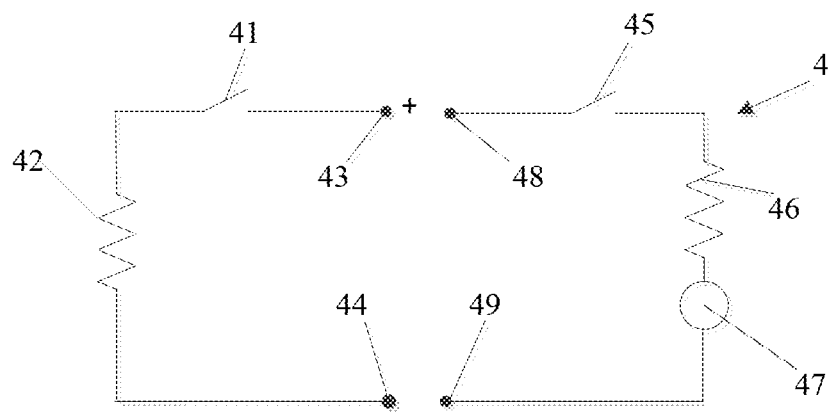
FIG. 4 is a schematic diagram of an automobile component simulation module.

As best shown in FIG. 4, the automobile component simulation module 4 includes a resistor energy-consuming component, which includes a first relay 41 and an energy-consuming resistor 42 being configured to provide the energy consumption required by the automobile component for the battery pack 3 according to the work command of the vehicle control unit 1. The resistor 42 may be adjustable, so power consumed can be changed. The automobile component simulation module 4 also includes an excitation charging component, which includes a second relay 45, an excitation power source 47, and a protective resistor 46 and configured to provide the charging required by the automobile component for the battery pack 3 according to the work command of the vehicle control unit 1. The resistor 46 may be adjustable, so power provided to battery can be changed. The two resistors 42 and 46 when either in an energy consuming loop or in a charging (regenerative braking energy recovery) loop, are adjustable in real time. In the present invention, only charging of the battery pack 3 caused by automobile regenerative braking is taken into consideration, and charging performed by the battery pack 3 of the automobile using external grid power source is not taken into consideration.

Figure 3:
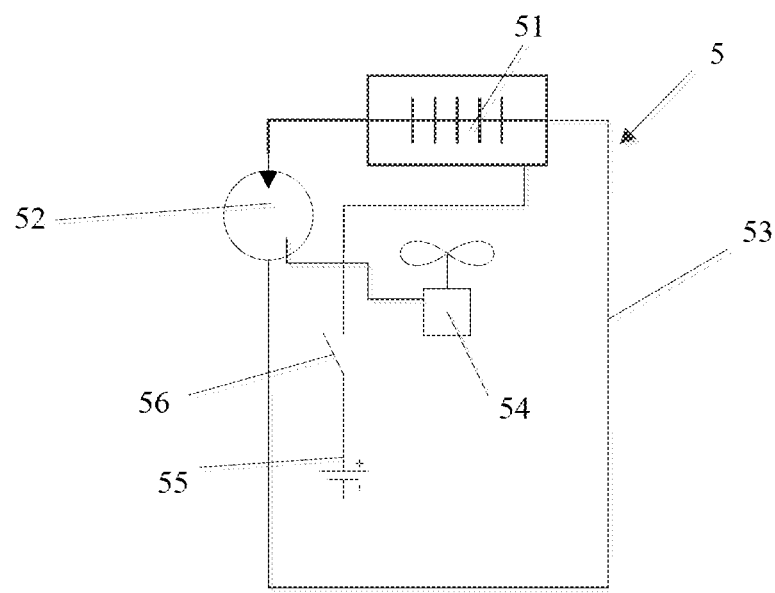
FIG. 3 is a schematic diagram of a thermal management unit.

As best shown in FIG. 3, the thermal management module 5 includes a fan 54, a heat sink 51, and a water pump 52 that are connected in series in sequence. The fan 54, the heat sink 51, and the water pump 52 are all connected to the battery pack 3 to perform heat dissipation on the battery pack 3. The thermal management module 5 further includes an external power source 55, and the external power source 55 is connected to the fan 54, the heat sink 51, and the water pump 52 in series to provide work power for the fan 54, the heat sink 51, and the water pump 52.

Figure 1:
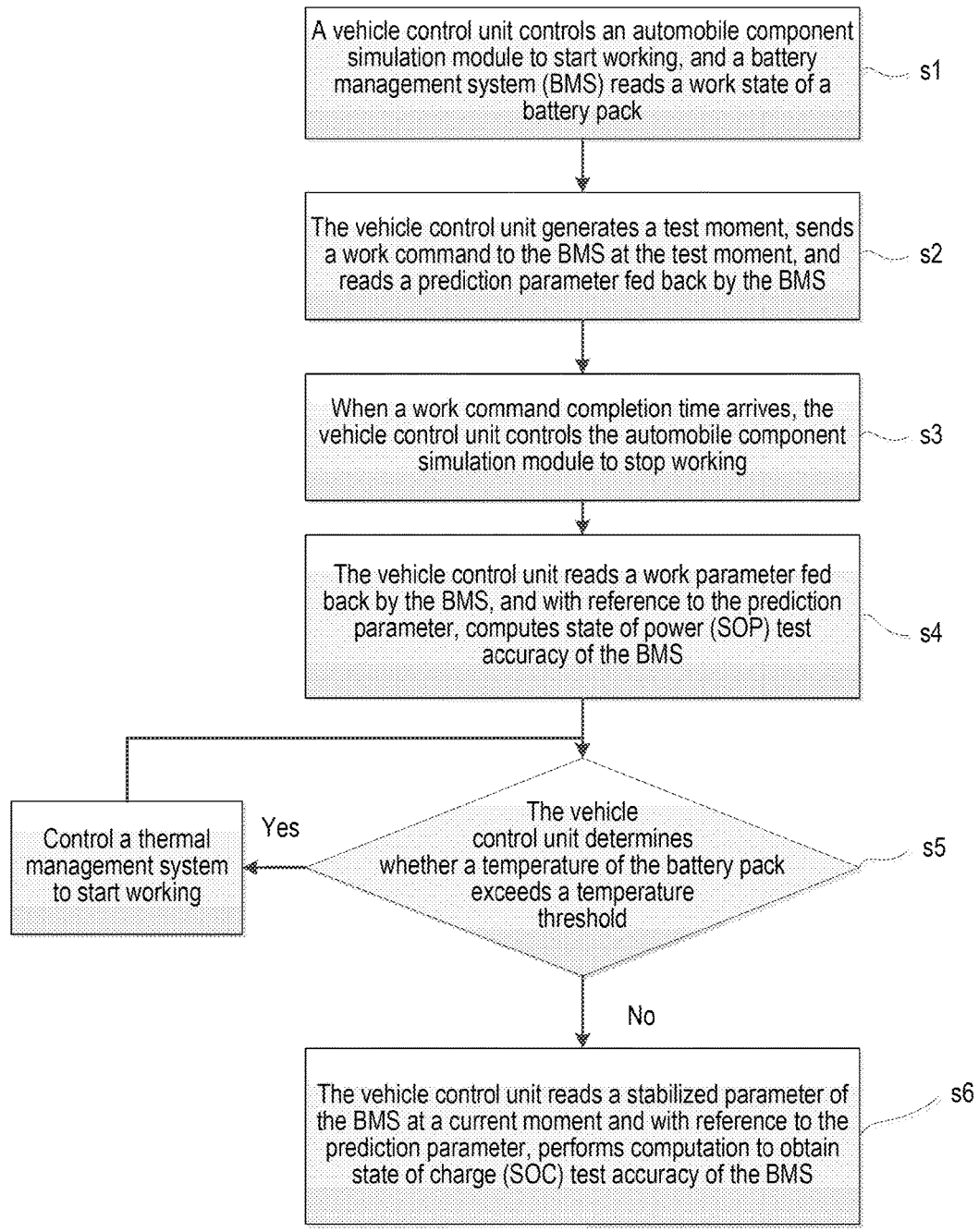
FIG. 1 is a flowchart of a method for automatically computing work accuracy of BMS offline.

In addition, a switch 56 may be connected between the external power source 55 and the fan 54, heat sink 51 and the water pump 52. When the BMS is operating, the battery pack 3 is essentially online and provides the necessary energy for the thermal management module 5. Otherwise, the thermal management module 5 uses the external power source 55 so that the SOC of the battery pack 3 is not impacted by this extra cooling action to maintain the temperature of the battery pack 3 when the battery pack 3 is commanded to be offline. Essentially, the external power source 55 provides energy to the thermal management module 5 when the BMS 2 is offline and does not provide energy to the thermal management module 5 when the BMS 2 is online By means of the foregoing apparatus, automatic offline detection on work accuracy of a BMS can be implemented, and as shown in FIG. 1, the detection method includes the following.

In step s1) controlling, by a vehicle control unit 1, an automobile component simulation module 4 to start working, and reading, by the BMS 2, a work state of a battery pack 3.

In step s2) generating, by the vehicle control unit 1, a test moment t, sending a work command to the BMS 2 at the test moment t, and reading a prediction parameter fed back by the BMS 2, where the prediction parameter includes an SOC value $SOC_{cal1}$ and a minimum voltage value $V_{min}$, predicted by the BMS 2, of the battery pack 3 when the work command is completed, and the minimum voltage value $V_{min}$ is specifically:

$$V_{min} = (V_{req}, V_{cal})$$

where $V_{req}$ is a voltage value required in the work command sent by the vehicle control unit 1, and $V_{cal}$ is an available voltage value obtained by the BMS 2 by means of computation according to the read work state of the battery pack 3.

In step s3) controlling, by the vehicle control unit 1, the automobile component simulation module 4 to stop working when a work command completion time arrives.

In step s4) reading, by the vehicle control unit 1, a work parameter fed back by the BMS 2, and with reference to the prediction parameter of step s2), computing SOP test accuracy $\epsilon_{SOP}$ of the BMS 2;

In substep s41) reading, by the vehicle control unit 1, a work parameter, that is, a voltage value $V_{cal1}$, of the battery pack 3 at a current moment, fed back by the BMS 2;

In substep s42) computing, by the vehicle control unit 1, the SOP test accuracy $\epsilon_{SOP}$ of the BMS 2 according to the voltage value of the battery pack 3 at the current moment obtained in step s41), where the SOP test accuracy $\varepsilon_{SOP}$ is specifically:

$$\varepsilon_{SOP} = \left| \frac{V_{cal1} - V_{min}}{V_{cal1}} \right|;$$

In step s5) determining, by the vehicle control unit 1, whether a temperature of the battery pack 3 exceeds a temperature threshold, if so, controlling a thermal management module 5 to start working, and returning to step s5), and otherwise, performing step s6).

In step s6) reading, by the vehicle control unit 1, a stabilized parameter of the BMS 2 at a current moment, and with reference to the prediction parameter of step s2), performing computation to obtain SOC test accuracy $\varepsilon_{SOC}$ of the BMS 2, where the SOC test accuracy $\varepsilon_{SOC}$, is specifically:

s61) reading, by the vehicle control unit 1, a stabilized parameter of the BMS 2 at a current moment, that is, a voltage value $V_{cal2}$ of the battery pack 3 at a current moment.

In step s62) reversely deriving, by the vehicle control unit 1 according to the voltage value of the battery pack 3 at the current moment obtained in step s61), an SOC value $SOC_{cal2}$ of the battery pack 3 at the current moment from an SOC-OCV curve of the battery pack 3. The SOC-OCV curve is a one-to-one relationship between SOC and OCV—open circuit voltage, when battery is at thermal and electric equilibria). This curve is normally temperature dependent. Here, one may assume temperature is within a controlled value by thermal management and hence one does not need to consider temperature dependence of SOC-OCV curve In step s63) computing, by the vehicle control unit 1, the SOC test accuracy $\varepsilon_{SOC}$ of the BMS 2 according to the SOC value $SOC_{cal2}$ of the battery pack 3 at the current moment obtained in step s62), where the SOC test accuracy $\varepsilon_{SOC}$ is specifically:

$$\varepsilon_{SOC} = \left| \frac{SOC_{cal2} - SOC_{cal1}}{SOC_{cal2}} \right|.$$

In step s2), the process of generating a test moment specifically includes:

s21) generating, by the vehicle control unit 1, a random number N;

s22) determining, by the vehicle control unit 1, whether the random number N is greater than a random number threshold $N_{cal}$, if so, performing step s23), and otherwise, returning to step s21); and s23) generating, by the vehicle control unit 1, a test moment t according to the random number N, where the test moment t is specifically:

$$t = t_{min} + N \times T$$

where $t_{min}$ is a minimum work time of the automobile component simulation module 4, and T is a specified cycle time.

It is worth mentioning that generation of this test moment includes determining a test moment in a manner of generating a random number, and in charging and power consumption processes, a test moment determined in such a way may cause a result of a test to be meaningless because a terminal voltage may not meet a requirement that the terminal voltage is not close enough to a minimum allowed battery pack voltage. Therefore, predetermination on a terminal voltage may also be added to the generation process of this test moment.

As such, if the voltage of the battery pack 3 is close to the minimum allowed value, more accurate results can be achieved. When discharging the battery, if by end of the test period, the voltage of the battery pack 3 is not smaller than the minimum allowed value, even if there is a larger inaccuracy, this does little harm. However, if inaccuracy of SOP prediction leads the voltage of battery pack 3 to be below a minimum voltage value, then it will impact battery life.

After SOC test accuracy and SOP test accuracy of the BMS are obtained, the SOC test accuracy and SOP test accuracy can be compared with specified precision ranges. As an example, an SOC accuracy range is ±2%, and an SOP accuracy range is ±5%. If the specified accuracy ranges are exceeded, it is necessary to further test and correct the BMS. Further, multiple such tests can be carried out for different SOC levels. Multiple iterations of this testing should be carried out repeatedly for different SOC levels and other factors, such as battery age.

In an alternative example, dedicated hardware implementations, such as application specific integrated circuits, programmable logic arrays and other hardware devices, can be constructed to implement one or more of the methods described herein. Applications that may include the apparatus and systems of various examples can broadly include a variety of electronic and computer systems. One or more examples described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

In accordance with various examples of the present disclosure, the methods described herein may be implemented by software programs executable by a computer system. Further, in an exemplary, non-limited example, implementations can include distributed processing, component/object distributed processing, and parallel processing. Alternatively, virtual computer system processing can be constructed to implement one or more of the methods or functionality as described herein.

Further the methods described herein may be embodied in a computer-readable medium. The term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the methods or operations disclosed herein.

As a person skilled in the art will readily appreciate, the above description is meant as an illustration of the principles of this invention. This description is not intended to limit the scope or application of this invention in that the invention is susceptible to modification, variation and change, without departing from spirit of this invention, as defined in the following claims.

The invention claimed is:

1. An apparatus for automatically computing work accuracy of a battery management system (BMS) offline and configured to detect the work accuracy of the BMS offline connected to a battery pack, the apparatus comprising:

a vehicle control unit, connected to the BMS and configured to send a work command to the BMS and compute the work accuracy of the BMS according to a parameter fed back by the BMS;

an automobile component simulation module, connected to the battery pack and vehicle control unit separately and configured to provide energy consumption and charging, required by an automobile component, of energy of the battery pack according to the work command of the vehicle control unit;

a thermal management module, connected to the battery pack and the vehicle control unit separately and configured to perform heat dissipation on the battery pack according to a command of the vehicle control unit; and wherein the automobile component simulation module comprises:

an adjustable resistor energy-consuming component, comprising a first relay and an energy-consuming resistor and configured to provide the energy consumption, required by the automobile component, for the battery pack according to the work command of the vehicle control unit; and an excitation charging component, comprising a second relay, an excitation power source, and a protective adjustable resistor and configured to provide the charging, required by the automobile component, for the battery pack according to the work command of the vehicle control unit.

2. The apparatus for automatically computing work accuracy of a BMS offline according to claim 1, wherein the thermal management module comprises a fan, a heat sink, and a water pump that are connected in series in sequence, and the fan, the heat sink, and the water pump are all connected to the battery pack to perform heat dissipation on the battery pack.

3. An apparatus for automatically computing work accuracy of a battery management system (BMS) offline and configured to detect the work accuracy of the BMS offline connected to a battery pack, the apparatus comprising:

a vehicle control unit, connected to the BMS and configured to send a work command to the BMS and compute the work accuracy of the BMS according to a parameter fed back by the BMS;

an automobile component simulation module, connected to the battery pack and vehicle control unit separately and configured to provide energy consumption and charging, required by an automobile component, of energy of the battery pack according to the work command of the vehicle control unit;

a thermal management module, connected to the battery pack and the vehicle control unit separately and configured to perform heat dissipation on the battery pack according to a command of the vehicle control unit;

wherein the thermal management module comprises a fan, a heat sink, and a water pump that are connected in series in sequence, and the fan, the heat sink, and the water pump are all connected to the battery pack to perform heat dissipation on the battery pack; and wherein the thermal management module further comprises:

an external power source, and the external power source is connected to the fan, the heat sink, and the water pump in series to provide work power for the fan, the heat sink, and the water pump; and wherein the external power source provided energy to the thermal management module when the BMS is offline and does not provide energy to the thermal management module when the BMS is online.

4. An apparatus for automatically computing work accuracy of a battery management system (BMS) offline and configured to detect the work accuracy of the BMS offline connected to a battery pack, the apparatus comprising:

a vehicle control unit, connected to the BMS and configured to send a work command to the BMS and compute the work accuracy of the BMS according to a parameter fed back by the BMS;

an automobile component simulation module, connected to the battery pack and vehicle control unit separately and configured to provide energy consumption and charging, required by an automobile component, of energy of the battery pack according to the work command of the vehicle control unit; and a thermal management module, connected to the battery pack and the vehicle control unit separately and configured to perform heat dissipation on the battery pack according to a command of the vehicle control unit; and wherein the vehicle control unit is configured to:

s1) control an automobile component simulation module to start working, and reading, by the BMS, a work state of a battery pack;

s2) generate a test moment t, sending a work command to the BMS at the test moment t, and reading a prediction parameter fed back by the BMS;

s3) control the automobile component simulation module to stop working when a work command completion time arrives;

s4) read a work parameter fed back by the BMS, and with reference to the prediction parameter of step s2), computing state of power (SOP) test accuracy $\epsilon_{SOP}$ of the BMS;

s5) determine whether a temperature of the battery pack exceeds a temperature threshold, if so, controlling a thermal management module to start working, and returning to step s5), and otherwise, performing step s6); and s6) read a stabilized parameter of the BMS at a current moment, and with reference to the prediction parameter of step s2), performing computation to obtain state of charge (SOC) test accuracy $\epsilon_{SOC}$ of the BMS.

5. The apparatus for automatically computing work accuracy of a BMS offline according to claim 4, wherein the vehicle control is further configured to generate the test moment by s21) generate a random number N;

s22) determine whether the random number N is greater than a random number threshold $N_{cal}$, if so, performing step s23), and otherwise, returning to step s21); and s23) generate a test moment t according to the random number N, wherein the test moment t is specifically:

$$t=t_{min}+N\times T$$

wherein $t_{min}$ is a minimum work time of the automobile component simulation module, and T is a specified cycle time.

6. The apparatus for automatically computing work accuracy of a BMS offline according to claim 4, wherein the prediction parameter comprises an SOC value $SOC_{cal1}$ and a minimum voltage value $V_{min}$, predicted by the BMS, of the battery pack when the work command is completed.

7. The apparatus for automatically computing work accuracy of a BMS offline according to claim 6, wherein the minimum voltage value $V_{min}$ is specifically:

$$V_{min}=\min(V_{req},V_{cal})$$

wherein $V_{req}$ is a voltage value required in the work command sent by the vehicle control unit, and $V_{cal}$ is an available voltage value obtained by the BMS by means of computation according to the read work state of the battery pack.

8. The apparatus for automatically computing work accuracy of a BMS offline according to claim 6, wherein the vehicle control unit is configured to:
   s41) reading, by the vehicle control unit, a work parameter, that is, a voltage value $V_{cal1}$ of the battery pack at a current moment, fed back by the BMS; and
   s42) computing, by the vehicle control unit, the SOP test accuracy $\epsilon_{SOP}$ of the BMS according to the voltage value of the battery pack at the current moment obtained in step s41), wherein the SOP test accuracy $\epsilon_{SOP}$ is specifically:

$$\varepsilon_{SOP} = \left| \frac{V_{cal1} - V_{min}}{V_{cal1}} \right|.$$

9. The apparatus for automatically computing work accuracy of a BMS offline according to claim 6, wherein the vehicle control unit is configured to:
   s61) read a stabilized parameter of the BMS at a current moment, that is, a voltage value $V_{cal2}$ of the battery pack at a current moment;
   s62) reversely derive, according to the voltage value of the battery pack at the current moment obtained in step s61), an SOC value $SOC_{cal2}$ of the battery pack at the current moment from an SOC-OCV curve of the battery pack; and
   s63) compute the SOC test accuracy $\epsilon_{SOC}$ of the BMS according to the SOC value $SOC_{cal2}$ of the battery pack at the current moment obtained in step s62), wherein the SOC test accuracy $\epsilon_{SOC}$ is specifically:

$$\varepsilon_{SOC} = \left| \frac{SOC_{cal2} - SOC_{cal1}}{SOC_{cal2}} \right|.$$

\* \* \* \* \*